Nov. 19, 1968 G. BOHLE 3,412,267

ELECTRONIC TIME DELAY CIRCUIT

Filed Sept. 20, 1965 2 Sheets-Sheet 1

INVENTOR.
GUNTER BOHLE
BY Charles S. Hall
ATTORNEY.

Nov. 19, 1968 G. BOHLE 3,412,267

ELECTRONIC TIME DELAY CIRCUIT

Filed Sept. 20, 1965 2 Sheets-Sheet 2

INVENTOR.
GUNTER BOHLE.

BY Charles S. Hall

ATTORNEY.

United States Patent Office 3,412,267
Patented Nov. 19, 1968

3,412,267
ELECTRONIC TIME DELAY CIRCUIT

Gunter Bohle, Livonia, Mich., assignor to Burroughs Corporation, Detroit, Mich., a corporation of Michigan Filed Sept. 20, 1965, Ser. No. 488,678
12 Claims. (Cl. 307—293)

This invention relates to an improved time delay circuit, and, more particularly, to an electronic time delay circuit adapted for use with logic circuits.

Conventional electronic timers having a time delay period of ten seconds or more suffer from several shortcomings when they are used to drive logic circuitry. Such circuits are usually not designed to work at voltages suitable for driving logic circuitry, except by employing electromechanical relays, and frequently require that the input signal be maintained for the entire timing period. Another frequent disadvantage in present day electronic timers is that considerable recovery time is required between timing cycles because most such timers utilize either the charge time or the discharge time of a capacitor for setting the timing period so that the timing capacitor must be charged or discharged before each new timing period.

It is therefore an object of this invention to provide a time delay circuit which is directly compatible with logic circuitry.

It is another object of this invention to provide an electronic time delay circuit which requires no delay between timing cycles.

These and other objects are achieved by a time delay circuit wherein and AND gate having two inputs is controlled at one input by a first switch and at its other input by a second switch. Before and after a timing cycle both inputs are enabled and the gate output is high. During a timing cycle one or the other or both inputs are dropped and the AND gate output is low.

Timing is provided by a capacitor which is initially fully charged within a short time after power is first applied to the circuit, and which is partially discharged and then recharged during each timing period. Charging and recharging of the capacitor is controlled by the first switch which is bistable and which, in its quiescent state, enables its associated AND gate input and also enables a charge path circuit to the capacitor. In its other stable state the first switch disables its associated AND gate input and completes a discharge path for the capacitor.

The first switch is under control of a feedback circuit which, when the capacitor charge has dropped from an initially full level to a predetermined level of partial discharge, returns the first switching circiut to its quiescent state so as to initiate recharging of the timing capacitor. The second switch is under control of the timing capacitor and is turned off only when the capacitor is in fully charged condition and is turned on so as to disable its associated AND gate input only when the capacitor drops below full charge condition.

With the first switching circuit in its quiescent state, the capacitor is fully charged within a short time after application of power to the circuit in preparation of generating a time delay period.

The time delay period is initiated by a triggering pulse whereby the first switching circuit is sent into its second stable state. This causes the timing capacitor to become discharged gradually, and one input of the AND gate to become disabled. After a predetermined time, in response to a partially discharged condition of the capacitor, the first switching circuit is turned off, its associated AND gate input is re-enabled, the discharging of the timing capacitor ceases and its recharging commences. When the capacitor is fully charged again the second switching circuit is turned off, permitting it to enable its associated AND gate input, whereby the AND gate is enabled at both of its inputs, ending the time delay period.

While some of the objects and a brief description of the invention have been given above, the invention and its objects will be best understood by referring to the following detailed description and to the accompanying drawings wherein.

Figure 1:
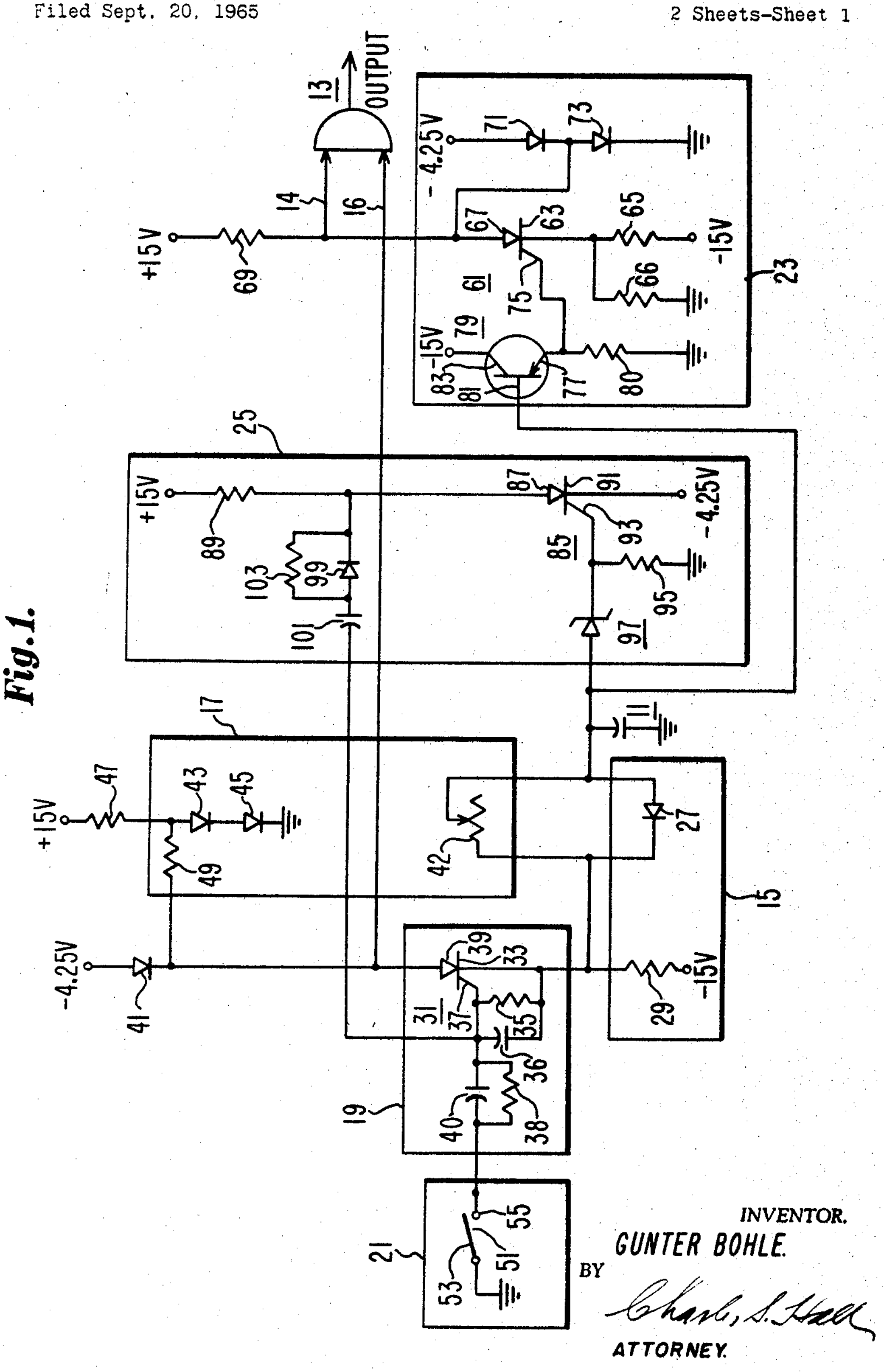
FIG. 1 is a diagram of a timing circuit incorporating my invention.

Referring to FIG. 1, different parts of the circuit are shown in blocks according to the functions they perform, and first a brief description will be given referring to the blocks in terms of their function only.

Two basic parts of the circuit are timing capacitor 11 and AND gate 13. Capacitor 11 is partially discharged and then re-charged during a delay cycle and serves to control several other parts of the circuit. AND gate 13 is the output stage of the circuit and has two inputs 14, 16 connected to various portions thereof. With the circuit in stand-by condition both inputs of AND gate 13 are enabled and the output of AND gate 13 is high. During the time delay period one or the other or both of the inputs of AND gate 13 are low and its output is also low.

Capacitor 11 is provided with a charge path circuit 15 and with a discharge path circuit 17 at one plate and is tied to a reference potential of ground at the other. The charge path circuit 15 and the discharge path circuit 17 are under the control of control circuit 19 which has two stable states. In its OFF state, in which it generally remains in the absence of an input pulse, control circuit 19 enables the charge path circuit 15 so as to permit charging of capacitor 11. In its ON state, into which it is driven by an input pulse, control circuit 19 initiates discharging of timing capacitor 11 through discharge path circuit 17.

Control circuit 19 is switched from its quiescent state to its second stable state by input circuit 21. Whenever control circuit 19 is de-energized timing capacitor 11 becomes fully charged through charge path circuit 15. When the input circuit 21 is operated, control circuit 19 changes from its quiescent to its second stable state causing discharge of timing capacitor 11 through discharge path circuit 17.

Control circuit 19 is also connected to an input of AND gate 13, which it enables only in its quiescent state so that when control circuit 19 is switched into its ON state, it disables its associated AND gate input. This marks the beginning of the delay time cycle.

Also connected to the ungrounded plate of capacitor 11 is the detecting circuit 23 whose output is connected to the other input 14 of AND gate 13. Detecting circuit 23 is designed to enable the associated AND gate input 14 when capacitor 11 is substantially fully charged. At all lesser charges on the timing capacitor 11, detector 23 disables the AND gate input 14.

With the time delay circuit in standby condition and timing capacitor 11 fully charged, full charge detecting circuit 23 enables AND gate input 14, and control circuit 19 enables AND gate input 16 so that the AND gate 13 is on and its output is high, i.e., in the ON state.

Application of a positive starting signal to the input of control circuit 19 from input circuit 21 causes control circuit 19 to change from its quiescent to its second stable state which in turn causes discharging of timing capacitor 11 through discharge path circuit 17 to commence. Additionally, the change of control circuit 19 from its quiescent to its second stable state immediately disables one input of AND gate 13, thus lowering the output, and shortly thereafter, the drop of timing capacitor 11 from a fully charged condition will cause, through detecting circuit 23, the other input of AND gate 13 to become also disabled.

Feedback circuit 25, connected at its input to the ungrounded plate of capacitor 11 and at its output to the input of control circuit 19, is adapted to switch control circuit 19 back to its quiescent state in response to a partially discharged condition of timing capacitor 11. Consequently, when capacitor 11 has become partially discharged, control circuit 19 reverts to its quiescent state.

With control circuit 19 in its quiescent state one input of AND gate 13 is enabled and the discharge path circuit 17 is interrupted while charge path circuit 15 is made operative so as to begin recharging timing capacitor 11 towards a fully charged state. After a time determined by the time constant of capacitor 11 and charge path circuit 15, the capacitor 11 reaches a fully charged state causing circuit 23 to enable the other input of AND gate 13. This results in all inputs of AND gate 13 being energized, marking the end of the time delay period.

Turning now to the individual components within the functional blocks described above, one plate of timing capacitor 11 is connected to a reference potential such as ground. Charge path circuit 15 comprises an asymmetrical conductor, such as diode 27, connected between the other plate of timing capacitor 11 and a negative 15 volt source through resistor 29. Control circuit 19 comprises a semiconductor switch, such as silicon controlled rectifier (SCR) 31, which is of the type that may be turned on or off by application of a positive or negative voltage, respectively, to its control electrodes. Cathode 33, a power electrode, of SCR 31 is connected to the junction point of diode 27 and resistor 29. SCR 31 is maintained in its quiescent non-conducting state by a zero bias between control electrode 37 and cathode 33 of SCR 31. Control circuit 19 also includes input resistor 38 and speed up capacitor 40 shunted across resistor 38, with one end of the pair being connected to control electrode 37 for coupling triggering signals to it. Anode 39 of SCR 31 is connected to a negative voltage source of −4.25 volts through clamping diode 41 which is poled so as to prevent power electrode 39 from dropping below approximately −4.5 volts when SCR 31 is conducting.

Discharge path circuit 17 includes a variable resistor 42 connected in parallel with diode 27 of charge path circuit 15 and also includes a pair of serially connected diodes 43 and 45, the pair being connected between ground and one end of a resistor 47 whose other end is connected to a +15 volt supply. The junction of diode 43 and resistor 47 is connected to the anode 39 of SCR 31 through resistor 49. In addition to serving as part of the discharge path circuit 17, resistor 49 and diodes 43 and 45 also serve to clamp anode 39 of SCR 31 to approximately +1 volt when SCR 31 is not conducting.

Input circuit 21 includes a switch 51 with a movable contact 53 connected to ground and with a stationary contact 55 connected through resistor 38 and capacitor 40 to control electrode 37 of SCR 31.

Full charge detector 23 comprises a semiconductor switch, such as silicon controlled rectifier (SCR) 61, whose cathode, or power electrode, 63 is connected to a −15 volt supply through resistor 65 and whose anode 67 is connected to a +15 volt supply through resistor 69. Anode 67, an output electrode, is also connected to input 14 of the coincidence gate 13. SCR 61 may be the same type as SCR 31. Anode 67 of SCR 61 is clamped between approximately +½ volt and −4.5 volts by a pair of diodes 71 and 73 connected in series with each other, with anode 67 connected to their junction. The anode of diode 71 is connected to a −4.25 volt supply and the cathode of diode 73 is connected to ground.

Control electrode 75 of SCR 61 is connected to the emitter 77 of emitter follower 79. The junction point of electrodes 75 and 77 is connected to ground through resistor 80. Since the control electrode 81 of emitter follower 79 is directly connected to the capacitor 11, the same voltage level is established at the control electrode 75 of SCR 61 as exists at the ungrounded plate of capacitor 11. Cathode 83 of transistor 79 is connected to a negative 15 voltage source. Emitter follower 79 serves as an impedance transforming device, in that it constitutes a high impedance to capacitor 11 for minimizing its drain current, and a low impedance current source for driving SCR 61.

A certain negative voltage level is established at the cathode 63 of SCR 61 by the voltage divider action of resistors 65 and 66. As long as the voltage at the control electrode 75 of SCR 61 is of a higher negative value than this cathode voltage, the SCR 61 is reverse biased and remains non-conducting. In this condition, anode 67 of SCR 61 is clamped to approximately ground level, enabling input 14 of AND gate 13. This is the case when capacitor 11 is fully charged .

As soon as capacitor 11 becomes partially discharged, the voltage at the control electrode 75 becomes slightly less negative than the cathode voltage and SCR 61 starts to conduct, holding input 14 of AND gate 13 in its blocking state.

Feedback circuit 25 comprises another semiconductor switch, such as silicon controlled rectifier (SCR) 85, whose anode 87 is connected to a +15 volt supply through resistor 89, and whose cathode 91, a power electrode, is connected directly to a −4.25 volt supply. SCR 85 may also be of the same type as SCR 31. Its control electrode 93 is connected to ground through resistor 95, and to the top plate of timing capacitor 11 through Zener diode 97, which has a Zener breakdown voltage selected to be less than the full charge voltage level upon timing capacitor 11. As a result, when the capacitor is fully charged, Zener diode 97 is in a conducting state and establishes a negative bias level at the control electrode 93 of SCR 85, thus holding SCR 85 nonconducting.

When the capacitor 11 is discharged to a predetermined level, Zener diode 97 ceases to conduct, permitting the junction point of resistor 95, control electrode 93, and Zener diode 97 to become slightly less than −4.25 volts. This turns on SCR 85 and drops its power electrode 87 from about +15 volts to approximately −4 volts. Negative going voltage level changes are coupled from the anode 87 of SCR 85 to control electrode 37 of SCR 31 through diode 99 and capacitor 101 connected in series therewith. Resistor 103, shunting diode 99, is provided for discharging capacitor 101.

Since capacitor 11 must be fully charged at the beginning of a timing period, power must be applied to the time delay circuit at least five seconds before the beginning of a timing period. When power to the circuit is turned on, shown on FIG. 2*a* as time *t*1, timing capacitor 11 begins to charge through diode 27 and resistor 29 toward −15 volts. Due to the ground potential applied to its gate, or control electrode 75, through resistor 80, SCR 51 turns on when power is initially applied to the circuit. SCR 85 also turns on due to the ground potential applied to its control electrode 93 through resistor 95. SCR 31 is not switched into conduction because of the zero bias condition heretofore described.

Figure 2:
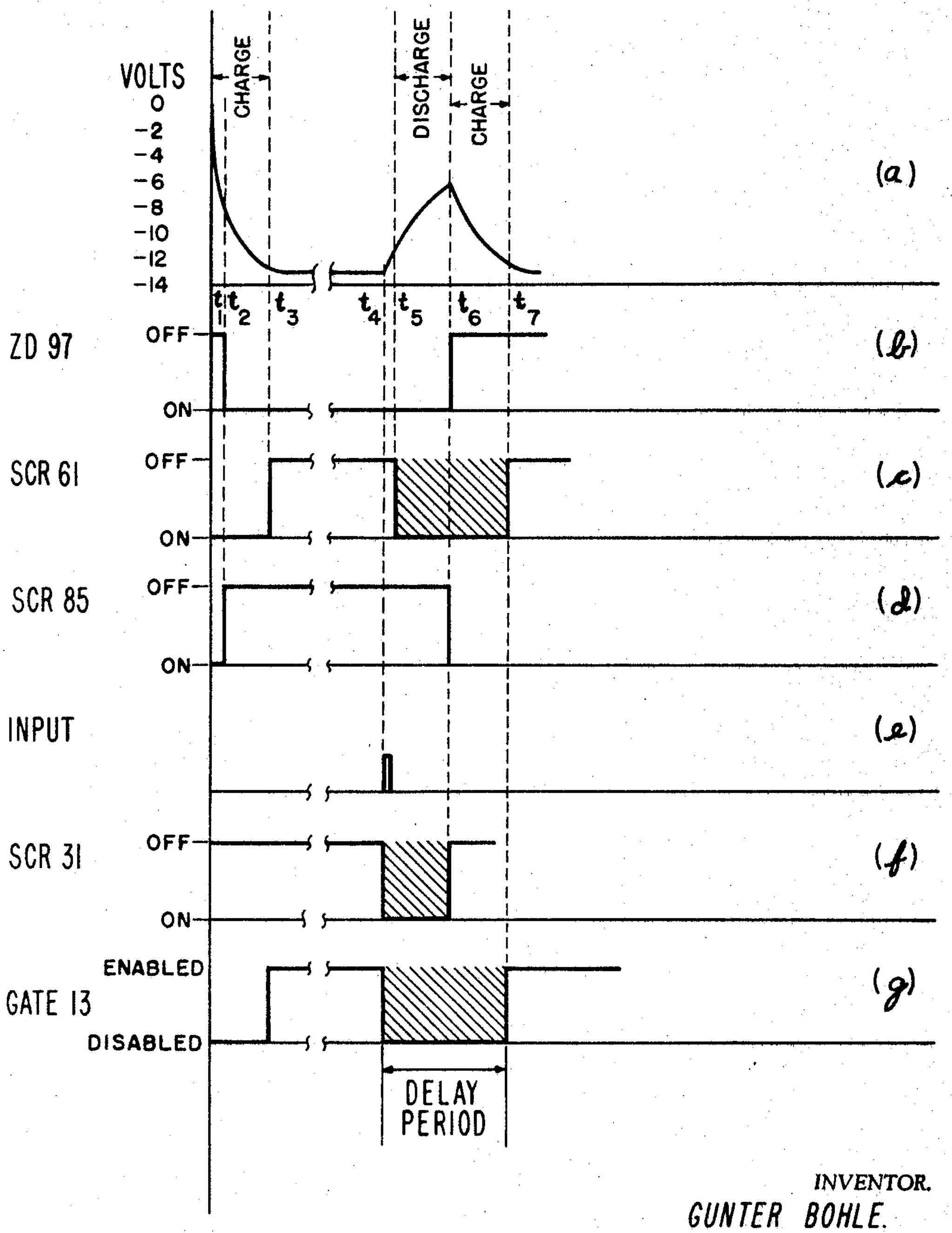
FIG. 2 is a timing diagram showing voltages before and during a timing cycle at various points in the circuit of FIG. 1.

At time $t2$, when timing capacitor 11 has reached a partial charge, which drops its top plate to about −6.8 volts, (FIG. 2*a*), Zener diode 97 conducts (FIG. 2*b*) pulling control electrode 93 of SCR 85 down to about −6.8 volts and SCR 85 is cut off (FIG. 2*d*).

The resulting positive potential shift occurring at the anode 87 of SCR 85 is prevented from reaching the control electrode 37 of SCR 31 by the poling of diode 99.

As capacitor 11 becomes further charged it reaches the point at time $t3$ (FIG. 2*a*) where emitter follower 79 conducts sufficiently to turn off SCR 61 (FIG. 2*c*). With SCR 61 cut off, input 14 of AND gate 13 is enabled, the AND gate is turned on, i.e., its output goes high as shown in FIG. 2*g*, and the timer is ready for operation.

The timing period is started at time $t4$ by closing switch 51 of input circuit 21, either momentarily or for the entire timing period. The resulting positive pulse at its control electrode 37 (FIG. 2*e*) turns on SCR 31 (FIG. 2*f*) causing AND gate input 16 and the gate output to be disabled by the negative potential applied to it through SCR 31 (FIG. 2*g*). The closing of SCR 31 completes the discharge path circuit and timing capacitor 11 begins to discharge through variable resistor 42, SCR 31, resistor 49, and diodes 43 and 45 to ground. Shortly thereafter, at time $t5$, SCR 61, theretofore prevented from firing by the full charge on timing capacitor 11 holding on emitter follower 79, fires (FIG. 2*c*) when its control electrode voltage becomes positive with respect to the cathode by the partial discharge of timing capacitor 11 (FIG. 2*a*) and input 14 of gate 13 drops to −4.5 volts. The output of gate 13 remains low (FIG. 2*g*).

It should be noted at this point that, because of the inherent inaccuracy of emitter follower 79 in detecting the exact instant at which capacitor 11 drops below full charge, the detector 23 is not used to define the beginning of the delay period but that, instead, this is defined by the control circuit 19 whose output (FIG. 2*f*) drops immediately at the beginning of the discharging of capacitor 11. If it were not for this feature, whereby accuracy of the time delay circuit is improved, a single output such as the anode of SCR 61 might serve as the output of the time delay circuit.

As the timing capacitor 11 continues to discharge, at time $t6$ (FIG. 2*a*) the Zener diode 97 stops conducting (FIG. 2*b*). Control electrode 93 of SCR 85 is raised to approximate −4 volts and SCR 85 is turned on. The resulting negative going voltage shift at the anode of SCR 85 (FIG. 2*d*) is applied through diode 99 and capacitor 101 to control electrode 37 of SCR 31, cutting it off (FIG. 2*f*) and causing input 16 of AND gate 13 to be enabled. Since the other input 14 of AND gate 13 is still low, the output of AND gate 13 remains low (FIG. 2*g*).

The cutting off of SCR 31 marks the beginning of the charging portion of the time delay cycle (FIG. 2*a*). As soon as SCR 31 is cut off, timing capacitor 11 starts charging through diode 27 and resistor 29 toward −15 volts. At time $t7$ the capacitor 11 becomes substantially fully charged (FIG. 2*a*). Emitter follower 79 is again turned on sufficiently to cut off SCR 61 (FIG. 2*c*), enabling the second input 14 of AND gate 13. With both of its inputs 14 and 16 enabled, the output of AND gate 13 goes high (FIG. 2*g*) and the timing period is completed.

The capacitor charging portion of the time delay period is of fixed length. The discharge portion of the time delay period may be varied in accordance with the setting of variable resistor 42.

The following values are those of a circuit actually built according to FIG. 1 for generating a time delay period adjustable between 3 and 13 seconds:

| Capacitors: | In microfarads, volts |
|---|---|
| 11 | 800/15 |
| 36 | 0.022/200 |
| 40 | 0.22/200 |
| 101 | 0.5/200 |

| Resistors: | In kilohms |
|---|---|
| 29 | 1.5 |
| 35 | 10 |
| 38 | 1,000 |
| 42 (adj.) | 10 |
| 47 | 10 |
| 49 | 2.2 |
| 65 | 1.1 |
| 66 | 10 |
| 69 | 5 |
| 80 | 1 |
| 89 | 10 |
| 95 | 100 |
| 103 | 1,000 |

| Diodes: | Type |
|---|---|
| 27 | IN2070. |
| 41 | BCX58-1 (transitron S592G). |
| 43 | IN2070. |
| 45 | IN2070. |
| 71 | BCX58-1 (transitron S592G). |
| 73 | BCX58-1 (transitron S592G). |
| 99 | BCX58-1 (transitron S592G). |

| Zener diode: | Type |
|---|---|
| 97 | IN752A |

| Silicon controlled rectifiers: | |
|---|---|
| 31 | C6G |
| 61 | C6G |
| 85 | C6G |

| Transistor: | |
|---|---|
| 79 | 2N1998 |

The circuit of FIG. 1 is quite flexible and may be used to drive AND gates which work with voltages other than zero or ground level for enabling and −4 volts for disabling. This may be easily achieved by changing the clamping voltage on the anodes of diodes 41 and 71 so as to permit SCR units 31 and 61 to drop to a voltage lower than or not as low as the −4 volts utilized in the circuit of FIG. 1.

What is claimed is:

1. A time delay circuit comprising, in combination,
coincidence gating means having at least two inputs;
capacitor means;
a charge path circuit for said capacitor means;
a discharge path circuit for said capacitor means;
switching means for enabling one input of said gating means only in response to a substantially fully charged condition of said capacitor means;
bi-stable means for enabling another input of said gating means and for enabling said charge path circuit to permit charging of said capacitor means when said bi-stable means is in its first state, and for disabling said charge path circuit and said other input of said gating means and for completing said discharge path circuit when said bi-stable means is in its second state;
means for setting said bi-stable means into its said second state to initiate discharging of said capacitor means; and
feedback means for returning said bi-stable means to its first state in response to a predetermined partially discharged condition of said capacitor means.

2. The time delay circuit of claim 1 wherein said bi-stable means is a semiconductor switch having a control electrode and wherein said feedback means and said means for setting said bi-stable means are coupled to said control electrode.

3. A time delay circuit comprising
coincidence gating means;
capacitor means;
detecting means coupled to one input of said coincidence gating means to enable said one input only when said capacitor means is substantially fully charged;

normally open switching means operative when closed to cause said capacitor means to be discharged and operative when open to cause said capacitor means to be charged and also to enable another input of said coincidence gating means;

means for closing said switching means; and feedback means coupled between said capacitor means and said switching means for opening said switching means when said capacitor means has become partially discharged to a predetermined level.

4. The time delay circuit of claim 3 wherein said detecting means includes a semiconductor switch having a control electrode biased to turn said switch on, said semiconductor switch also having an output electrode coupled to said one input of said coincidence means for enabling said one input when said switch in non-conducting, said detecting means also including a transistor coupling stage connected to said capacitor means and to said semiconductor switch for rendering said semiconductor switch non-conducting when said capacitor means is substantially fully charged.

5. The time delay circuit of claim 4 wherein said normally open switching means comprises a second semiconductor switch and wherein said feedback means includes a third semiconductor switch operative when turned on to turn off said second semiconductor switch; said feedback means additionally including a Zener diode coupled between said capacitor means and said third semiconductor switch for keeping said third semiconductor switch turned off until said capacitor means has become partially discharged to said predetermined level.

6. A time delay circuit comprising, in combination, a multi-input coincidence circuit for producing a voltage level when its inputs are coincidentally subjected to a pre-determined potential;

at least one capacitor;

a charge path circuit for gradually fully charging said one capacitor;

means coupled to one input of said coincidence circuit and to said one capacitor for enabling said one input in response to a nearly full charge on said one capacitor and for disabling said one input at all lesser charges on said one capacitor;

a discharge path circuit for discharging said one capacitor;

normally open switching means operative when closed to interrupt said charge path circuit and to complete said discharge path circuit and operative when open to enable another input of said coincidence circuit;

means for closing said switching means; and means coupled to said one capacitor and to said switching means for opening said switching means in response to a predetermined partially discharged condition of said one capacitor.

7. The time delay circuit of claim 6 wherein said charge path circuit includes an asymmetrical conductor, and wherein said discharge path circuit includes variable resistor means connected in parallel with said asymmetrical conductor for permitting adjustment of the discharge time of said one capacitor.

8. The time delay circuit of claim 7 wherein said means coupled to one input of said coincidence circuit includes a two-stage switching circuit comprising a semiconductor switch having first and second power electrodes and a control electrode, said semiconductor switch having a first current conducting state and a second current blocking state between said pair of power electrodes, said two-stage switching circuit also including a transistor circuit coupled to said semiconductor switch in its blocking state when said one capacitor is substantially fully charged and for setting said semiconductor switch into its conducting state when said capacitor is less than substantially fully charged.

9. The time delay circuit of claim 7 wherein said normally open switching means includes a first semiconductor switch having first and second power electrodes and a control electrode, said first semiconductor switch having a first current conducting state and a second current blocking state between said pair of power electrodes, said first power electrode being coupled to said asymmetrical conductor for controlling its conduction and said second power electrode being coupled to said other input of said coincidence means for enabling it when said semiconductor switch is in its current blocking state.

10. The time delay circuit of claim 6 wherein said means coupled to said one capacitor and to said switching means includes a semiconductor switch having first and second power electrodes and a control electrode, said semiconductor switch having a first current conducting state and a second current blocking state between said first and second power electrodes; biasing means for setting said semiconductor switch into its conducting state; a Zener diode coupled between said one capacitor and said control electrode of said semiconductor switch for holding said switch in its blocking state when said one capacitor is charged above a predetermined level; and asymmetrically conducting means coupling one of said power electrodes to said normally open switching means for opening said normally open switching means in response to a change of said semiconductor switch from its blocking state to its conducting state.

11. The time delay circuit of claim 9 wherein said means coupled to said one capacitor and to said normally open switching means includes a second semiconductor switch having a power electrode coupled to the control electrode of said first semiconductor switch and having a control electrode coupled to said one capacitor for rendering said second semiconductor switch conducting and said normally open switching means non-conducting in response to a predetermined partially discharged condition of said one capacitor.

12. The time delay circuit of claim 11 wherein said means coupled to said one capacitor and to said switching means additionally includes Zener diode means coupled between said one capacitor and said control electrode of said second semiconductor switch for determining the state of discharge at which said second semiconductor switch is rendered conducting.

References Cited

UNITED STATES PATENTS 2,767,311 10/1956 Meyer -------------- 328—58

ARTHUR GAUSS, *Primary Examiner.*

H. DIXON, *Assistant Examiner.*